US006576965B2

(12) United States Patent
Eikyu et al.

(10) Patent No.: US 6,576,965 B2
(45) Date of Patent: Jun. 10, 2003

(54) SEMICONDUCTOR DEVICE WITH LIGHTLY DOPED DRAIN LAYER

(75) Inventors: Katsumi Eikyu, Tokyo (JP); Yukio Nishida, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/414,846

(22) Filed: Oct. 8, 1999

(65) Prior Publication Data

US 2002/0105066 A1 Aug. 8, 2002

(30) Foreign Application Priority Data

Apr. 26, 1999 (JP) .......................................... 11-117771

(51) Int. Cl.$^7$ ............................................. H01L 29/76
(52) U.S. Cl. .................... 257/408; 257/336; 257/344; 257/350; 438/301; 438/302; 438/305
(58) Field of Search ................................ 257/408, 336, 257/344, 900, 338, 350, 386, 394, 397; 438/301, 302, 305, 230, 231

(56) References Cited

U.S. PATENT DOCUMENTS

| | | | | |
|---|---|---|---|---|
| 5,565,700 | A | * 10/1996 | Chou et al. | 257/408 |
| 5,668,024 | A | * 9/1997 | Tsai et al. | 438/199 |
| 5,793,090 | A | * 8/1998 | Gardner et al. | 257/408 |
| 5,851,893 | A | * 12/1998 | Gardner et al. | 438/305 |
| 6,096,641 | A | * 8/2000 | Kunikiyo | 438/653 |

FOREIGN PATENT DOCUMENTS

| | | | |
|---|---|---|---|
| JP | 5-283688 A | * 10/1993 | |
| JP | 7-297393 | 11/1995 | |
| JP | 2000-208766 A | * 7/2000 | |

OTHER PUBLICATIONS 10 1245,353, Sep. 18, 2002 pending.

* cited by examiner

Primary Examiner—Steven Loke
Assistant Examiner—Donghee Kang
(74) Attorney, Agent, or Firm—Oblon, Spivak, McClelland, Maier & Neustadt, P.C.

(57) ABSTRACT

Arsenic is ion-implanted through a thin insulative through film formed on an active region in the vicinity of a gate insulating film towards the inside of a semiconductor substrate at a dose of 3E13 cm$^{-2}$ at an energy of 100 keV at a tilt angle, which is made by an ion implantation direction and a normal direction (NL), of 45 degrees with respect to a (100) surface of the semiconductor substrate, with which a channeling phenomenon can be caused. Next, phosphorus is ion-implanted towards the inside of the semiconductor substrate at a dose of 1E13 cm$^{-2}$ at an energy of 50 keV at an angle with which no channeling phenomenon can be caused. After that, a sidewall is formed and then arsenic is ion-implanted towards the inside of the semiconductor substrate at a dose of 4E15 cm$^{-2}$ at an energy of 50 keV at an angle with which no channeling phenomenon can be caused, to form n$^+$ layers.

5 Claims, 9 Drawing Sheets

SEMICONDUCTOR DEVICE WITH LIGHTLY DOPED DRAIN LAYER

BACKGROUND OF THE INVENTION

1. Field of the Invention

The present invention relates to a semiconductor device for a semiconductor LSI, and more particularly to a lightly doped drain (hereinafter, referred to as LDD) layer structure and a technique of forming the same.

2. Description of the Background Art

An LDD layer structure has been conventionally used in a MOSFET to prevent deterioration in hot carrier. For example, FIG. 10 is a vertical section showing an n-type MOSFET with single LDD layer structure as a first prior art. As shown in FIG. 10, a semiconductor device 1P1 where a gate insulating film 11P and a gate electrode 5P are formed in this order on a surface of a semiconductor substrate 2P having a p-well formed by ion-implantation with boron (B) is once implanted with phosphorus (P) ion or arsenic (As) ion to form LDD layers 8P and 10P almost symmetrically and after that, a sidewall 6P is formed and then arsenic ion or the like is further implanted and diffused to form high-concentration (n$^+$) source/drain regions 3P and 4P. For reference, a flow of manufacturing the n-type MOSFET of FIG. 10 is shown in FIG. 11.

As a second prior art which is a variation of the first prior art, an n-type MOSFET with double LDD layer structure is proposed in Japanese Patent Application Laid Open Gazette No. 7-297393. The structure of this n-type MOSFET 1P2 is shown in FIG. 12. In the n-type MOSFET 1P2 of FIG. 12, an arsenic ion is once implanted to form the inner LDD layers 8P and 10P in the same manner as the first prior art, and outer LDD layers 7P and 9P made of P layer with high diffusion coefficient are formed by utilizing diffusion through a heat treatment, covering the inner LDD layers 8P and 10P, respectively.

(1) The MOSFET with single LDD layer structure of the first prior art has an advantage that the LDD layers (arsenic layers 8P and 10P of FIG. 10) relieve a drain electric field to thereby improve hot-carrier resistance and withstand voltage. On the other hand, the MOSFET with single LDD layer structure has a disadvantage that the LDD layers work as parasitic resistance between the source and drain to thereby deteriorate driving capability.

(2) In the double LDD layer structure of the second prior art, a double-layered structure consisting of the outer P layer of relatively low concentration and the inner arsenic layer of relatively high concentration located near a surface forms a step-like impurity concentration distribution, and therefore the LDD layer made of P of relatively low concentration relieves the drain electric field and the LDD layer made of arsenic of relatively high concentration reduces the resistance element, to thereby achieve a driving capability higher than the first prior art.

This structure of the second prior art, however, causes a new problem that a region where a sum of the concentration distributions of the arsenic layer of relatively high concentration and the phosphorus layer of relatively low concentration varies in a step-like manner is created inside the semiconductor substrate, to locally generate a strong electric field therein, and consequently the hot-carrier resistance is deteriorated as compared with the structure of the first prior art. To clarify this point, an impurity concentration distribution with respect to a horizontal direction in parallel with the surface of the semiconductor substrate (an impurity concentration distribution at the depth of 0.5 μm inside the semiconductor substrate from an interface between the gate insulating film and the surface of the semiconductor substrate) in the n-type MOSFET of double LDD structure as shown in FIG. 12 of Japanese Patent Application Laid Open Gazette No. 7-297393 is simulated by the inventor of the present invention. The simulation result (not known) is shown in FIG. 13.

In FIG. 13, the horizontal axis represents a horizontal direction x of FIG. 12 with the position x=0.001 μm indicating a center portion of the surface of the semiconductor substrate 2P sandwiched by end portions of the phosphorus layers 7P and 9P (n_(2)) of FIG. 12, and the vertical axis y of FIG. 13 represents a vertical direction y from the center portion towards the inside of the semiconductor substrate 2P. As shown in FIG. 13, the concentration of phosphorus which is an impurity element of the outer LDD layer increases from 1E16 cm$^{-3}$ to 1E18 cm$^3$ with relatively great gradient and from the position x=0.08 μm of FIG. 13, the concentration of arsenic sharply increases with a gradient greater than that of phosphorus. Since the inner LDD layers 8P and 10P of FIG. 12 include both impurities, phosphorus and arsenic, the impurity concentration of the inner LDD layers 8P and 10P is the sum of both concentrations of phosphorus and arsenic from the position x=0.08 μm of FIG. 13 (end portions of the LDD layers 8P and 10P) and therefore sharply increases. Especially, at an intersection P1 of FIG. 13, as the concentrations of both impurities, that is, phosphorus and arsenic are equal to each other, the impurity concentration of the LDD layers 8P and 10P of FIG. 12 sharply increases up to almost twice in a step-like manner. Further, since a region P2 of FIG. 13 is a junction between the LDD layer 8P (10P) and n$^+$ layer 3P (4P), the concentration connection becomes a step-like one also in this region.

Thus, it is disadvantageous that the second prior art can show only intermediate characteristics between the single LDD layer structure of the first prior art and a single drain structure in an integrated evaluation of its characteristics such as driving capability, withstand voltage and hot-carrier resistance.

SUMMARY OF THE INVENTION

The present invention is directed to a semiconductor device. According to a first aspect of the present invention, the semiconductor device comprises: a semiconductor substrate having a channel impurity of a first conductivity type; a first high-concentration impurity region formed from a first surface region in a surface of the semiconductor substrate towards the inside of the semiconductor substrate, having at least one kind of impurity of a second conductivity type whose concentration is higher than that of the channel impurity; an insulating film formed on a second surface region adjacent to the first surface region in the surface of the semiconductor substrate; a control electrode formed on a surface of the insulating film; a second high-concentration impurity region formed from a third surface region adjacent to the second surface region in the surface of the semiconductor substrate towards the inside of the semiconductor substrate, being opposed to the first high-concentration impurity region, having the at least one kind of impurity identical to that of the first high-concentration impurity region; and a first lightly doped drain layer formed from a fourth surface region in the second surface region on the side of an interface between the first and second surface regions towards the inside of the semiconductor substrate, being joined to at least part of an end surface of the first high-concentration impurity region opposed to the second high-concentration impurity region, having a first impurity of the second conductivity type whose concentration is lower than that of the at least one kind of impurity in the first and second high-concentration impurity regions. In the semiconductor device of the first aspect, the first lightly doped drain layer comprises a first main distribution having a first concentration gradient corresponding to an impurity concentration variation with respect to a horizontal direction in which an end surface of the control electrode is viewed from a center portion of the control electrode in parallel to the surface of the semiconductor substrate, where the first impurity is distributed inside the semiconductor substrate; and a first tail distribution having a second concentration gradient which is smaller than the first concentration gradient and provides a gradual increase in concentration of the first impurity towards the concentration of the channel impurity, where the first impurity is distributed inside the semiconductor substrate deeper than the first main distribution.

According to a second aspect of the present invention, the semiconductor device of the first aspect further comprises: a second lightly doped drain layer formed from a fifth surface region located from the interface between the first and second surface regions up to an inner side of an end of the fourth surface region in the first lightly doped drain layer towards the inside of the first lightly doped drain layer, being joined to the end surface of the first high-concentration impurity region, having a second impurity of the second conductivity type whose concentration is lower than that of the at least one kind of impurity in the first and second high-concentration impurity regions and the first impurity. In the semiconductor device of the second aspect, the second lightly doped drain layer comprises a second main distribution having a concentration distribution with respect to the horizontal direction which can compensate a decrease in the concentration of the first impurity near a junction between the first main distribution and the end surface of the first high-concentration impurity region, where the second impurity is distributed inside the second lightly doped drain layer.

According to a third aspect of the present invention, the semiconductor device of the second aspect further comprises: a first nitrogen layer formed from the fifth surface region towards the inside of the second lightly doped drain layer.

According to a fourth aspect of the present invention, the semiconductor device of the second aspect further comprises: a third lightly doped drain layer formed from a six surface region in the second surface region on the side of an interface between the second and third surface regions towards the inside of the semiconductor substrate, being joined to at least part of an end surface of the second high-concentration impurity region, having a third impurity of the second conductivity type whose concentration is lower than that of the at least one kind of impurity in the first and second high-concentration impurity regions. In the semiconductor device of the fourth aspect, the third lightly doped drain layer comprises a third main distribution having a third concentration gradient, where the third impurity is distributed inside the semiconductor substrate; and a second tail distribution having a fourth concentration gradient which is smaller than the third concentration gradient and provides a gradual increase in concentration of the third impurity towards the concentration of the channel impurity, where the third impurity is distributed inside the semiconductor substrate deeper than the third main distribution.

According to a fifth aspect of the present invention, the semiconductor device of the fourth aspect further comprises:
a fourth lightly doped drain layer formed from a seventh surface region located from the interface between the second and third surface regions up to an inner side of an end of the sixth surface region in the third lightly doped drain layer towards the inside of the third lightly doped drain layer, being joined to the end surface of the second high-concentration impurity region, having a fourth impurity of the second conductivity type whose concentration is lower than that of the at least one kind of impurity in the first and second high-concentration impurity regions and the third impurity. In the semiconductor device of the fifth aspect, the fourth lightly doped drain layer comprises a fourth main distribution having a concentration distribution with respect to the horizontal direction which can compensate a decrease in the concentration of the third impurity near a junction between the third main distribution and the end surface of the second high-concentration impurity region, where the fourth impurity is distributed inside the third lightly doped drain layer.

According to a sixth aspect of the present invention, the semiconductor device of the fifth aspect further comprises: a second nitrogen layer formed from the seventh surface region towards the inside of the fourth lightly doped drain layer.

According to a seventh aspect of the present invention, the semiconductor device comprises: a semiconductor substrate having a channel impurity of a first conductivity type; a high-concentration impurity region formed from a region in a surface of the semiconductor substrate towards the inside of the semiconductor substrate, having an impurity of a second conductivity type whose concentration is higher than that of the channel impurity; an insulating film formed on a surface region of the semiconductor substrate near an end surface of the high-concentration impurity region; a control electrode formed on a surface of the insulating film; and a first low-concentration impurity region having a first impurity which has a first distribution obtained by implantation with ion from the side of an end surface of the control electrode towards the inside of the semiconductor substrate below the control electrode at a tilt angle made by a normal direction of the surface of the semiconductor substrate and an ion-implantation direction, which can cause a channeling phenomenon, wherein concentration of the first impurity is lower than an impurity concentration in the high-concentration impurity region.

According to an eighth aspect of the present invention, the semiconductor device of the seventh aspect further comprises: a second low-concentration impurity region having a second impurity which has a second distribution obtained by implantation with ion from a surface of the first low-concentration impurity region to the inside of the first low-concentration impurity region at an angle that can not cause the channeling phenomenon, wherein concentration of the second impurity is lower than the impurity concentration of the high-concentration impurity region and both of the first and second impurities are distributed in the low-concentration impurity region.

According to a ninth aspect of the present invention, the semiconductor device of the eighth aspect further comprises: a nitrogen layer formed from a surface region of the second low-concentration impurity region towards the inside of the second low-concentration impurity region.

The present invention is also directed to a method of manufacturing a semiconductor device. According to a tenth aspect of the present invention, the method comprises the steps of: (a) providing a semiconductor substrate, an insulating film and a control electrode formed on a surface of the semiconductor substrate in this order, and an insulative through film formed on a surface region of the semiconductor substrate in an active region in the vicinity of an end surface of the insulating film, the insulative through an film having a thickness smaller than that of the insulating film; and (b) ion-implanting a first impurity through the insulative through film towards the inside of the semiconductor substrate below the control electrode at a first tilt angle which is an angle made by a normal direction of the surface of the semiconductor substrate and an ion-implantation direction and can cause a channeling phenomenon, to form a first impurity layer where a first impurity is distributed.

According to an eleventh aspect of the present invention, the method of the tenth aspect further comprises the step of: (c) ion-implanting a second impurity through the insulative through film from an surface region of the first impurity layer towards the inside of the first impurity layer at a second tilt angle that can not cause the channeling phenomenon, to form a second impurity layer inside the first impurity layer, where both the first and second impurities are distributed.

According to a twelfth aspect of the present invention, the method of the eleventh aspect further comprises the step of: (d) ion-implanting nitrogen through the insulative through film from a surface region of the second impurity layer towards the inside of the second impurity layer at a third tilt angle that can not cause the channeling phenomenon, to form a nitrogen layer inside the second impurity layer near the surface region.

In the semiconductor device of the first aspect, since the first lightly doped drain layer has the first tail distribution extending up to relatively great depth in (the channel portion of) the semiconductor substrate and the first tail distribution has the concentration gradient which gradually increases up to about the channel impurity concentration with respect to the horizontal direction, the junction between the first impurity providing the first tail distribution of the first lightly doped drain layer and the channel impurity in the semiconductor substrate is a pn junction between low-concentration impurities and the depletion layer created in the pn junction is widened in its range. This remarkably relieves a drain electric field and more significantly improves a withstand voltage and a hot-carrier resistance than in the prior-art MOSFETs with single and double lightly doped drain layers.

In the semiconductor device of the second aspect, the low-concentration distribution created in the region within the first main distribution region of the first lightly doped drain layer and near the junction between the first lightly doped drain layer and the first high-concentration impurity region can be compensated by the concentration of the second impurity of the same conductivity type in the second lightly doped drain layer, and this makes it possible to form an impurity concentration distribution, in the region where the first and second main distributions are overlapped, at a relatively shallow depth from the surface of the semiconductor substrate, where the impurity concentration distribution which is the sum of concentrations of the first and second impurities can be connected smoothly to the impurity concentration in first high-concentration impurity region. As a result, the low-concentration layer created near the surface of the semiconductor substrate by the first lightly doped drain layer, i.e., local generation of high electric field caused by the high-resistance layer can be sufficiently prevented to avoid a fall of on current and a driving capability higher than that of the prior-art MOSFET with single lightly doped drain layer structure is achieved.

In the semiconductor device of the third and sixth aspects, since a dangling bond created in the interface between the semiconductor substrate and the insulating film can be terminated by nitrogen, a further improvement in hot-carrier resistance is achieved through reduction in interface state.

In the semiconductor device of the fourth aspect, since the junction between the third impurity of low concentration which forms the second tail distribution in the third lightly doped drain layer and channel impurity of low concentration is created at a relatively great depth from the surface of the semiconductor substrate to widen the range of the depletion layer, a drain electric field can be further relieved and a hot-carrier resistance can be further improved.

In the semiconductor device of the fifth aspect, since the fourth lightly doped drain layer is superimposed within the low-concentration region which is created by the third lightly doped drain layer at a relatively shallow depth by nature, the above low concentration created by the third impurity is compensated by the concentration of the fourth impurity, to smoothly connect the impurity concentration distribution which is the sum of concentrations of the third and fourth impurities to the impurity concentration within the second high-concentration impurity region. Therefore, generation of the high-resistance layer created by the third lightly doped drain layer at relatively shallow depth from the surface of the semiconductor substrate, i.e., local generation of high electric field can be effectively prevented, to achieve a still higher driving capability.

In the semiconductor device of the seventh aspect, the electric field is sufficiently relieved by using the tail distribution of the first impurity through the channeling phenomenon, to improve a hot-carrier resistance.

In the semiconductor device of the eighth aspect, the impurity concentration created near the surface region by the first low-concentration impurity region can be compensated by the second impurity concentration, and deterioration in driving capability caused by the sufficient improvement in hot-carrier resistance is sufficiently prevented, to improve the driving capability.

In the semiconductor device of the ninth aspect, a further improvement in hot-carrier resistance is achieved.

In the method of the tenth aspect, only by using the ion implantation step where the first impurity is ion-implanted at the first tilt angle with which the channeling phenomenon can be caused, a remarkable improvement in hot-carrier resistance is ensured with easy and reliable process.

In the method of the eleventh aspect, only by addition of one ion implantation step where the second impurity is further ion-implanted at the second tilt angle, an improvement in driving capability is also achieved.

In the method of the twelfth aspect, since the nitrogen implantation is performed after forming a sufficient channeling tail distribution up to the great depth from the surface of the semiconductor substrate, the dangling bond near the surface of the semiconductor substrate can be terminated reliably by the implanted nitrogen.

An object of the present invention is to achieve a driving capability higher than that of the first prior art by preventing deterioration in driving capability while improving a hot-carrier resistance by relieving a drain electric field more than in the first and second prior arts.

These and other objects, features, aspects and advantages of the present invention will become more apparent from the following detailed description of the present invention when taken in conjunction with the accompanying drawings.

DESCRIPTION OF THE PREFERRED EMBODIMENTS

The characteristic feature of a semiconductor device of the present invention lies in having ① main LDD layers (later-discussed first and third LDD layers) formed from both end surface sides of a gate electrode (also referred to as control electrode) made of polysilicon and the like and a gate insulating film (simply referred to as insulating film) made of $SiO_2$ film and the like towards a great depth (in y direction) inside the semiconductor substrate on the side of a channel region, where impurities are distributed with a concentration gradient of gradual increase with respect to a horizontal direction (x direction), up to near an impurity concentration almost the same as that of the channel impurity, and ② sub LDD layers (later-discussed second and fourth LDD layers) having impurities additionally implanted in the y direction so as to compensate the concentration in a low-concentration region formed in the vicinity of the substrate surface by said main LDD layers and distributed at a relatively shallow depth in the main LDD layers. Specifically, the semiconductor device with double LDD layer structure of the present invention, with its emphasis on improvement in hot-carrier resistance, is intended to achieve a hot-carrier resistance higher than that of the first prior art and further improve its driving capability. In order to achieve this, a channeling tail distribution of the main LDD layer sufficiently relieves an electric field and a low-concentration impurity distribution created between the main LDD layer and a high-concentration impurity region ($n^+$ layer or $p^+$ layer) serving as a source/drain layer or the like is compensated by the concentration distribution of additionally-implanted impurities included in the sub LDD layer, to smoothly connect the concentrations of all the impurities in the sub LDD layer to the impurity concentration in the high-concentration impurity region.

Hereinafter, taking an n-type MOSFET as a typical example of the semiconductor device of the present invention, more specific exemplary structure and method of manufacturing the semiconductor device of the present invention will be discussed as the first and second preferred embodiments.

The First Preferred Embodiment

Figure 1:
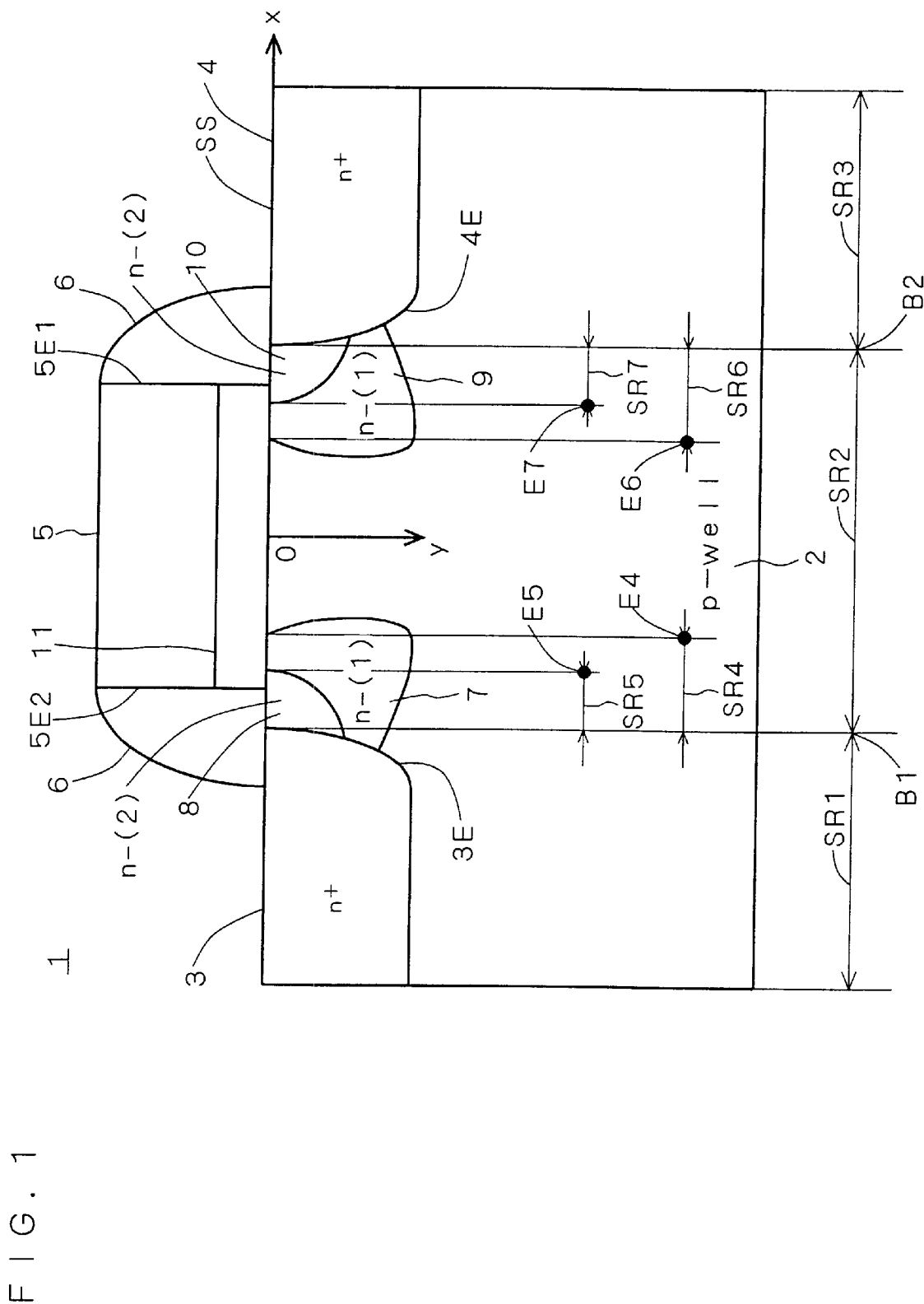
FIG. 1 is a vertical section showing an n-type MOSFET with double LDD layer structure in accordance with a first preferred embodiment of the present invention.

FIG. 1 is a vertical section showing a structure of an n-type MOSFET 1 in accordance with the present invention. In FIG. 1, a surface SS of a semiconductor substrate 2 in which an acceptor such as boron (B) (serving as a channel impurity of a first conductivity type) is implanted into an active region in advance to form a p-well is divided into first to third surface regions SR1 to SR3, for convenience of description. Moreover, the second surface region SR2 adjacent to the first and third surface regions SR1 and SR3 and sandwiched therebetween consists of a fourth surface region SR4 extending from the side of a first boundary B1 between the first and second surface regions SR1 and SR2 towards a center portion (point O) of the second surface region SR2, a sixth surface region SR6 extending from the side of a second boundary B2 between the second and third surface regions SR2 and SR3 towards the center portion and a center surface region (whose center portion is the center point O which is an intersection of x axis extending in a horizontal direction or transversal direction in parallel to the surface SS and y axis orthogonal to the x axis and extending towards the inside of the semiconductor substrate 2 (in a vertical direction)) between the fourth and sixth surface regions SR4 and SR6. Further, the fourth surface region SR4 has a fifth surface region SR5 extending from the first boundary B1 up to an end portion E5 located on the inner side to an end portion E4 of the region SR4 and a surface region between the fourth and fifth surface regions SR4 and SR5. Symmetrically, the sixth surface region SR6 has a seventh surface region SR7 extending from the second boundary B2 up to an end portion E7 located on the inner side to an end portion E6 of the region SR6 and a surface region between the sixth and seventh surface regions SR6 and SR7.

Like the prior arts, the n-type MOSFET 1 of the present invention has a first high-concentration impurity region ($n^+$ layer) formed from the first surface region SR1 towards the inside of the semiconductor substrate 2, consisting of at least one kind of impurity (herein including arsenic (As) and phosphorus (P)) of a second conductivity type (n type) whose concentration is higher than that of the channel impurity, a gate insulating film 11 and a gate electrode 5 formed in this order on the center surface region in the second surface region SR2 and parts of the fourth and sixth surface regions SR4 and SR6, a sidewall 6 joined to both end surfaces 5E1 and 5E2 of the gate electrode 5 and both end surfaces of the gate insulating film 11 to surround the gate electrode 5 and the gate insulating film 11, and a second high-concentration impurity region (n⁺ layer) 4 formed from the third surface region SR3 towards the inside of the semiconductor substrate 2 with its one end surface 4E opposed to one end surface 3E of the first high-concentration impurity region 3, including an impurity of the same kind, same concentration and same conductivity type as that of the region 3.

Characteristic constituent elements of the n-type MOSFET 1 of the present invention are first to fourth LDD layers 7 to 10. Specifically, the n-type MOSFET 1 of the present invention has (1) a first LDD layer 7 extending from the fourth surface region SR4, being jointed to at least part of the end surface 3E (its depth may become larger than the depth or thickness of the first high-concentration impurity region 3 depending on impurity implantation conditions, and in such a case, jointed to the entire portion of the end surface 3E), up to a great depth inside the semiconductor substrate 2, especially on the side of the channel region. The first LDD layer 7 has a first impurity (herein arsenic (As) of relatively small diffusion coefficient) of the second conductivity type (n type) whose concentration is lower (n⁻(1)) than the impurity concentration of the first high-concentration impurity region 3.

Figure 2:
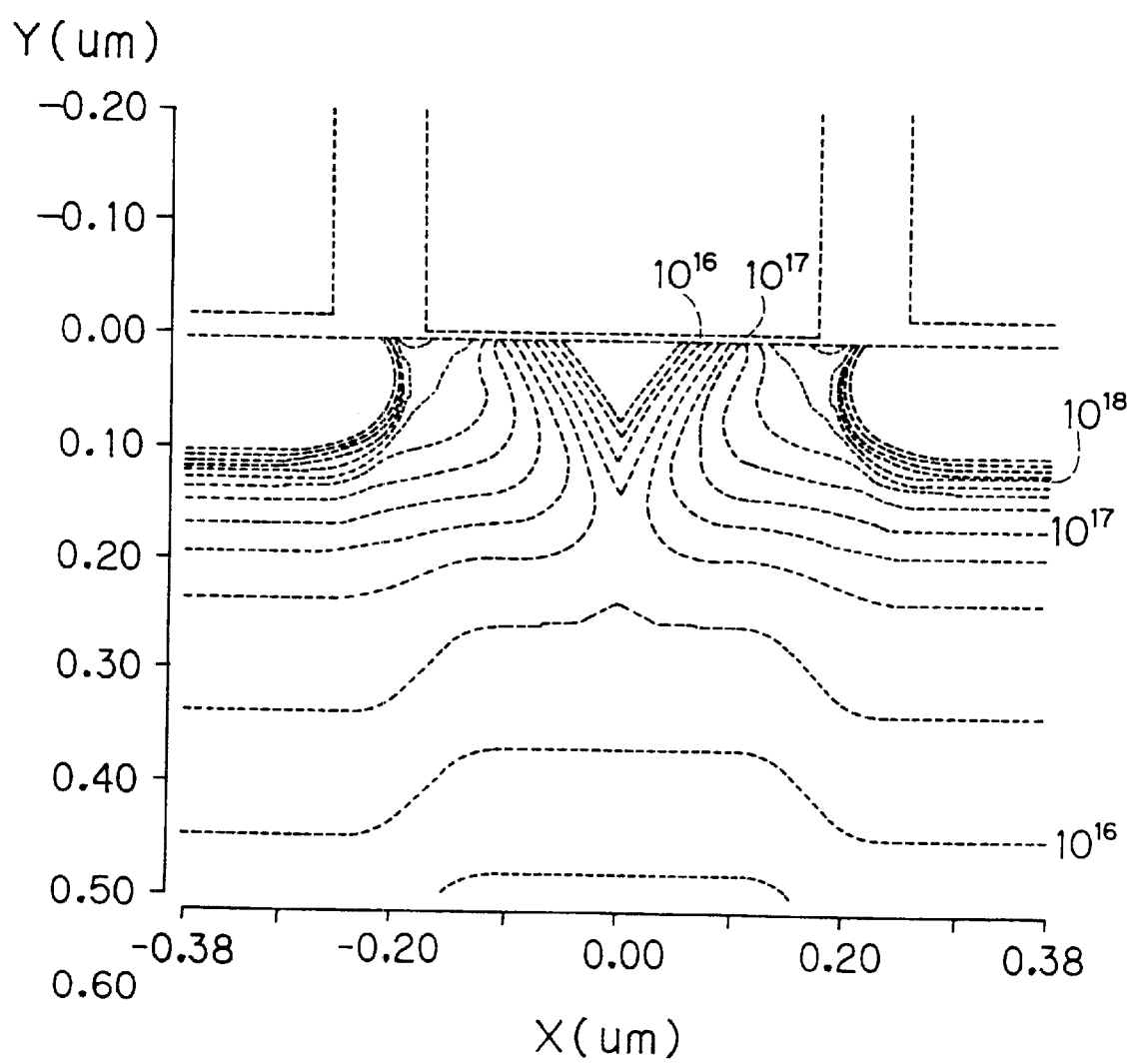
FIG. 2 shows a simulation result on two-dimensional distribution of arsenic concentration in the n-type MOSFET with double LDD layer structure in accordance with the first preferred embodiment of the present invention.

FIG. 2 shows a simulation result of two-dimensional distribution of arsenic concentration in a case where arsenic ions are implanted into the p-well at a dose of 3E13 cm⁻² at a tilt angle (defined later) of 45 degrees with respect to the (100) surface SS at an energy of 100 keV to form an n channel-type MOSFET having a gate length of 0.35 μm. Further, the MOSFET has a sidewall width of 60 nm. Herein, the order of concentration of boron as a channel impurity is 10¹⁷ cm⁻³, the horizontal and vertical axes of FIG. 2 correspond to the x and y axes of FIG. 1, respectively, and the left side in the two-dimensional distribution of arsenic concentration represents that of the first LDD layer 7.

As is clear from the simulation result, a concentration gradient representing a variation in concentration of arsenic as the first impurity with respect to −x direction from the position of x=0, i.e., the direction on the side of the first boundary B1 (horizontal direction) is large (very narrow spacing between concentration distributions or very small extension of the concentration distribution in the horizontal direction of the channel) at a portion in a range of relatively shallow depth (about 0≦y≦0.1 μm) from the substrate surface SS in the y direction. On the other hand, it can be seen that at a portion deeper in the y direction, the spacing of the arsenic concentration distributions becomes wider (allegorically speaking, it seems as if a spacing between contour lines becomes larger), and an apex or tip of each arsenic concentration distribution viewed from the side of the first boundary B1 is gentle along a linear direction at an angle or a tilt of 45 degrees counterclockwise viewed from a normal direction of the surface SS. This gentle tail distribution is a distribution caused by a channeling effect as the result of arsenic ion implantation at a tilt angle (the tilt angle in the (100) surface is ±45 degrees) with which a channeling phenomenon discussed later in the second preferred embodiment can be caused, i.e., a channeling tail distribution, and the tail distribution is herein termed "a first tail distribution" and an arsenic concentration gradient at that time is termed "a second concentration gradient". By contrast, an arsenic concentration distribution at a shallow depth (about 0≦y≦0.1 μm), as one not caused by the channeling phenomenon, is termed "a first main distribution" and an arsenic concentration gradient at that time is termed "a first concentration gradient".

Figure 3:
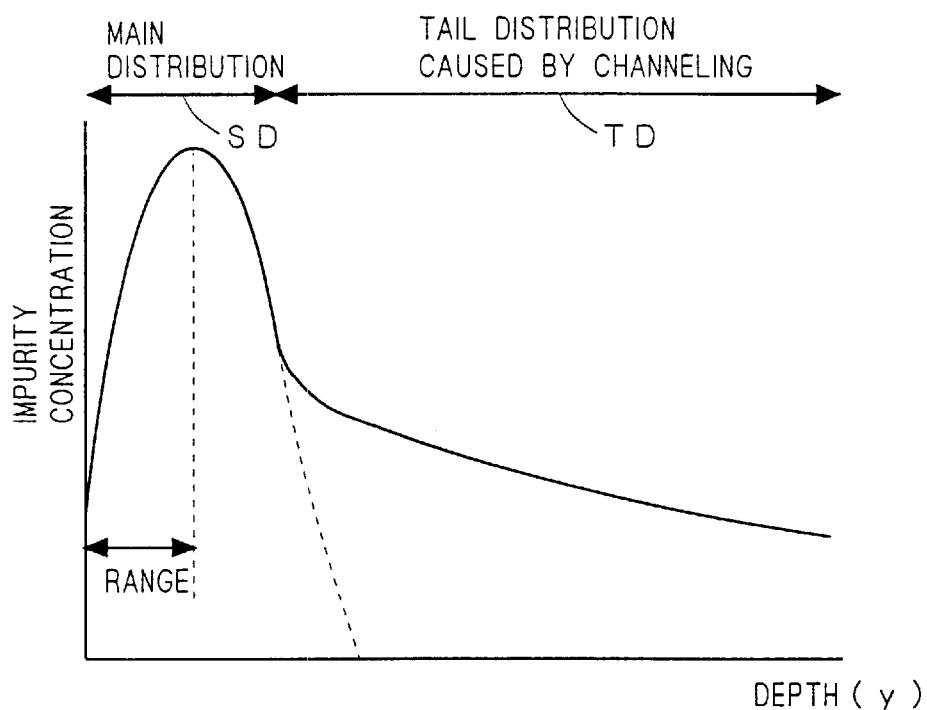
FIG. 3 shows a main distribution and a tail distribution of arsenic concentration in the n-type MOSFET with double LDD layer structure in accordance with the first preferred embodiment of the present invention.

As is clear from FIG. 2, it can be seen that two kinds of abundant arsenic concentration distributions i.e., the first main distribution and the first tail distribution trailing which follows extend in the first LDD layer 7 from the substrate surface SS with respect to the y direction. This is schematically shown in FIG. 3. Specifically, the arsenic concentration distribution in the +y direction has ① the first main distribution SD, like Gaussian distribution, which is not caused by the channeling phenomenon and in which the range of the implanted ions exists at a relatively shallow depth from the substrate surface SS towards the +y direction and ② a second tail distribution TD made of a distribution of arsenic reaching a great depth inside the substrate due to the channeling phenomenon, where the arsenic concentration gradually or monotonously decreases in the +y direction.

Figure 4:
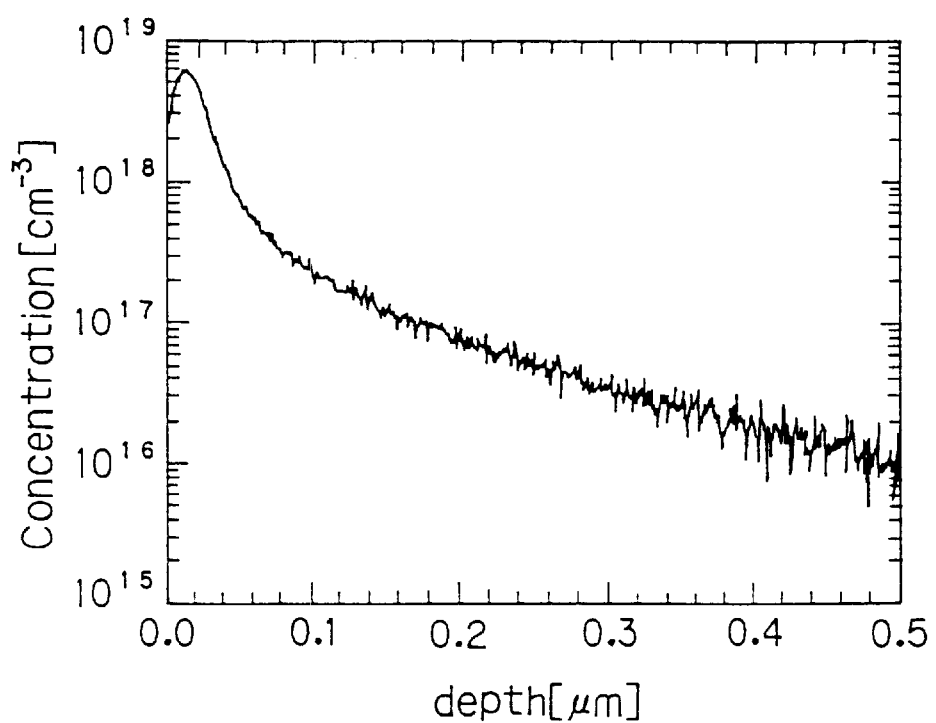
FIG. 4 shows a measurement result on the main distribution and the tail distribution of arsenic concentration in the n-type MOSFET with double LDD layer structure in accordance with the first preferred embodiment of the present invention.

FIG. 4 shows an experimental result to demonstrate the impurity concentration distribution of arsenic with respect to the depth direction y shown in FIG. 3, i.e., SIMS analysis data indicating an impurity concentration of arsenic in the first LDD layer 7 (or the later-discussed third LDD layer 9) obtained by implanting the (100) surface of the semiconductor substrate 2 with arsenic at a dose of 2.8E13 cm⁻² at an energy of 30 keV at a tilt angle of 45 degrees. From FIG. 4 can be clearly seen the channeling phenomenon where the concentration of arsenic gradually decreases from some midpoint of the main distribution up to a great depth inside the substrate, i.e., generation of the tail distribution.

Further, the MOSFET 1 of the present invention has (2) a second LDD layer (n⁻(2)) 8 formed from the fifth surface region SR5 up to the inside in the vicinity of the surface region of the first LDD layer 7. Moreover, the layer 8 has (i) the second impurity (e.g., phosphorus (P)) of the second conductivity type (n type) whose concentration is lower than that of the impurity in the first high-concentration impurity region (n⁺) 3 and (ii) arsenic as the first impurity included in the first LDD layer 7. Though arsenic can be used as the second impurity, instead of phosphorus, the simulation analysis by the present inventor proves that phosphorus is preferable to arsenic as the second impurity used in the second LDD layer 8, and in other words, a preferable concentration distribution can be obtained as discussed later by implanting phosphorus as the second impurity from the fifth surface region SR5 at the tilt angle with which no channeling phenomenon can be caused. The concentration distribution of phosphorus as the second impurity in the second LDD layer 8 also makes a second main distribution (of Gaussian distribution shape corresponding to the first main distribution SD of FIG. 3) having a very small range. The most important point is a concentration setting of phosphorus as the second impurity. Specifically, the concentration distribution of phosphorus as the second impurity has a distribution to compensate the decrease in concentration of arsenic as the first impurity near the junction between the first LDD layer 7 and the end surface 3E at a relatively shallow depth from the substrate surface SS in the y direction or a concentration gradient with respect to the horizontal direction x. This will be discussed in detail on the basis of a simulation result of FIG. 5.

Figure 5:
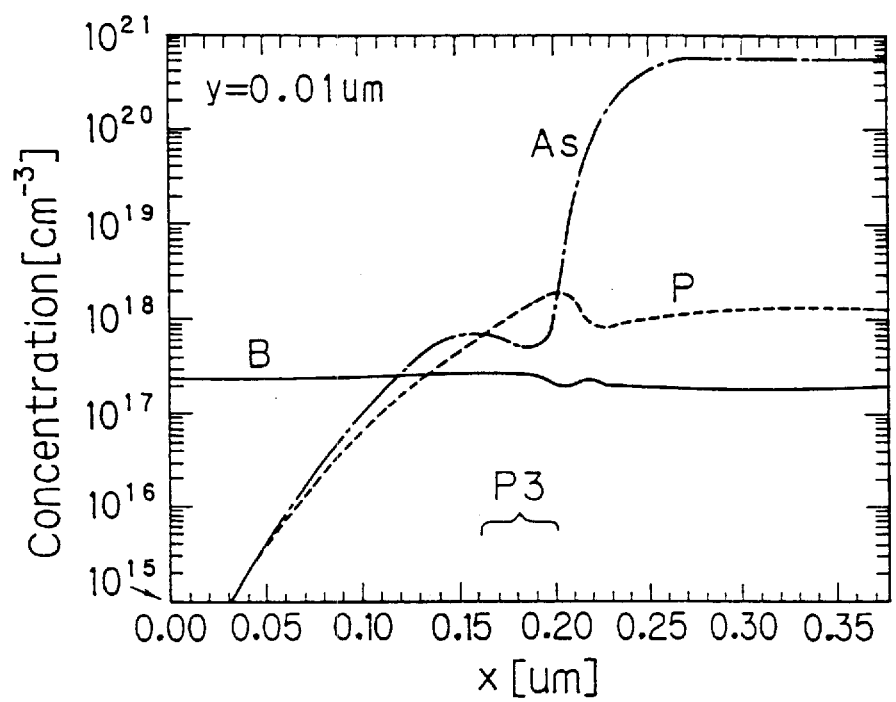
FIG. 5 shows a simulation result on concentration distributions of impurities with respect to a horizontal direction at the depth of 0.01 μm inside a channel portion from an interface between a gate insulating film and a semiconductor substrate in the n-type MOSFET with double LDD layer structure in accordance with the first preferred embodiment of the present invention.

FIG. 5 shows a simulation result representing a concentration distribution with respect to the horizontal direction (x direction) of the impurities, boron, arsenic and phosphorus, at the depth of 10 nm from an interface between the (100) substrate surface SS and the gate insulating film 11 (where the gate length is set at 0.35 μm). This simulation result is one in a case where the end portions E4 and E5 of FIG. 1 coincide with each other depending on the simulation conditions, and the −x direction in FIG. 1 should be regarded as the +x direction in FIG. 5, for convenience. When the phosphorus having the distribution of FIG. 5 is used as the second impurity, though both concentration gradients of arsenic and phosphorus almost coincide with each other when x ranges from 0.03 μm to 0.15 μm, the concentration gradient of phosphorus is not very important herein. More important point is correlation in concentration distribution between phosphorus and arsenic in a region P3 of FIG. 5 (corresponding to a region near the end surface 3E at a relatively shallow depth in the y direction). Specifically, the concentration of arsenic once decreases from the maximum value to the minimum value in the region P3 while the concentration of phosphorus tends toward an increase enough to compensate the above decrease in concentration of arsenic also in the region P3. Thus, it is significant that the concentration of phosphorus is so set as to sufficiently compensate the decrease in concentration of arsenic in the region P3. In this sense, the concentration of phosphorus is also the same as that of arsenic in the second LDD layer 8. Since a sum of concentrations of arsenic and phosphorus as the first and second impurities is the impurity concentration in the second LDD layer 8, a level difference in impurity concentration between the first LDD layer 7 (arsenic) and the n⁺ layer (arsenic) 3 which can be formed in the inner region near the surface is effectively compensated by the concentration of phosphorus in the second LDD layer 8, and a concentration variation of the n-type impurity in the horizontal direction (x) is smoothly connected to a concentration variation of the n-type impurity with respect to the horizontal direction (x) in the n⁺ layer 3 in the second LDD layer 8.

Figure 6:
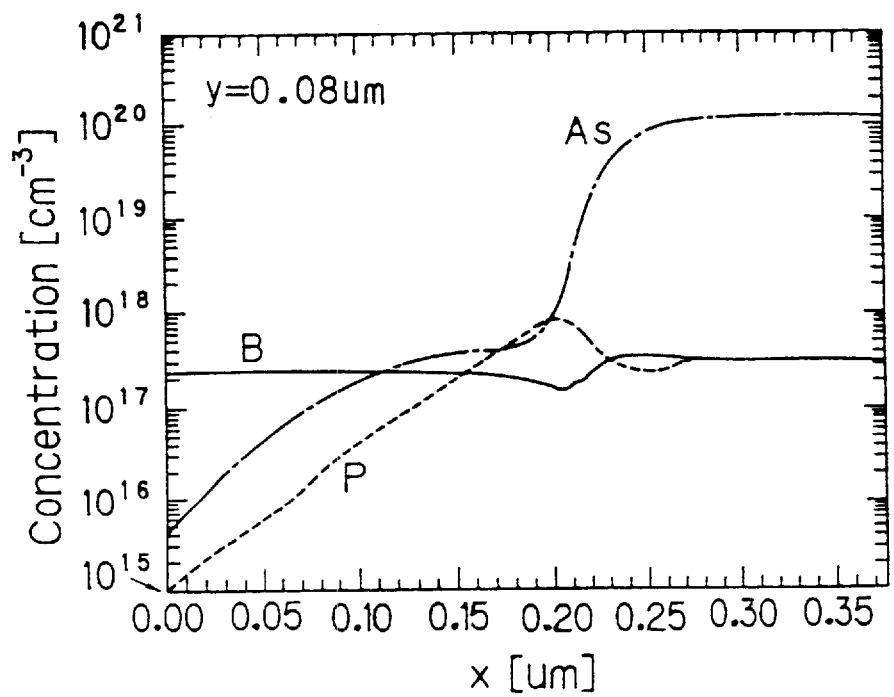
FIG. 6 shows a simulation result on concentration distributions of the impurities with respect to the horizontal direction at the depth of 0.08 9 μm inside the channel portion from the interface between the gate insulating film and the semiconductor substrate in the n-type MOSFET with double LDD layer structure in accordance with the first preferred embodiment of the present invention.

Further, a simulation result representing concentration variations of boron, arsenic and phosphorus with respect to the horizontal direction (x) at the depth of 80 nm, still deeper than that of FIG. 5 in the y direction, is shown in FIG. 6. In FIG. 6, since the concentration of phosphorus is sufficiently smaller than those of boron as the channel impurity and arsenic as the first impurity in a range where x is very small, the impurity concentration gradient in the first LDD layer 7 at the depth of 80 nm is almost determined by the second concentration gradient of arsenic as the first impurity. More important point is that the second concentration gradient of arsenic as the first impurity is smaller than the first concentration gradient (see FIG. 5) of arsenic as the first impurity forming the first main distribution and has a gradient providing a gradual increase in concentration of arsenic as the first impurity towards around the concentration value (about 2.5E17 cm⁻³) of boron as the channel impurity. At the great depth from the substrate surface, if the concentration distribution of arsenic as the first impurity ranges from the same as that of boron as the channel impurity to one-tenth thereof, a PN junction of arsenic and boron which are both of low concentrations is created deeper inside the substrate, and this reduces an effective junction concentration to sufficiently widen the range of a depletion layer, and consequently a drain electric field can be effectively relieved.

As shown in FIG. 1, the MOSFET 1 of the present invention has a third LDD layer 9 (n⁻(1)) and a fourth LDD layer 10 (n⁻(2)) to be symmetrical to the first and second LDD layers 7 and 8 in structure. Specifically, the third LDD layer 9 is formed from the sixth surface region SR6 up to a great depth inside the semiconductor substrate, being joined to at least a part of the end surface 4E of the second high-concentration impurity region (n⁺ layer) 4, due to the channeling effect of arsenic as a third impurity. A simulation result representing a two-dimensional distribution of concentration of arsenic as the third impurity corresponds to the right-hand portion (on the side of +x direction) of FIG. 2 and the results of FIGS. 3 to 5 apply to the layer 9. The layer 9 has ① a third main distribution SD having a third concentration gradient of arsenic almost the same as the first concentration gradient and ② the second tail distribution (TD) having a fourth concentration gradient smaller than the third concentration gradient, with an inclination providing a gradual increase in concentration towards around the concentration value (about 10¹⁷ cm⁻³) of boron. Existence of the layer 9 further relieves the drain electric field and allows further improvement in hot-carrier resistance.

The fourth LDD layer 10 is formed from the seventh surface region SR7 towards a region in the vicinity of the surface in the third LDD layer 9, being joined entirely to the end surface 4E, including phosphorus (or arsenic) as a fourth impurity of the second conductivity type (n type) whose concentration is low (n⁻), which is additionally implanted at a tilt angle other than 45 degrees as discussed later and the already-existing arsenic as the third impurity. The already-mentioned simulation result of FIG. 5 also applies to the layer 10, and the phosphorus as the fourth impurity in the layer 10 forms a fourth main distribution having a concentration distribution with respect to the horizontal direction (x) enough to compensate the concentration of arsenic as the third impurity in the low-concentration region near the junction between the third LDD layer 9 and the second high-concentration impurity region 4. This allows the distribution made of a sum of concentrations of arsenic as the third impurity and phosphorus as the fourth impurity to be smoothly connected to the concentration distribution of an impurity (herein arsenic or phosphorus) in the second high-concentration impurity region (n⁺ layer) 4 even near the end surface 4E in the fourth LDD layer 10. As a result, no step-like concentration distribution is created and the region near the surface at a shallow depth has still lower resistance.

Thus, the MOSFET of the present invention has a double LDD layer structure consisting of (A) the first and third LDD layers 7 and 9 (the first low-concentration impurity regions) extending from the gate electrode end towards the inside of the semiconductor (the channel region) in a direction of 45 degrees and each having (i) the main distribution and (ii) the tail distribution where the concentration distribution with respect to the horizontal direction so gradually varies within a range from about one-tenth of the channel impurity concentration to a concentration almost the same as the channel impurity concentration and (B) the second and fourth LDD layers 8 and 10 (the second low-concentration impurity regions) which compensate the concentrations in the low-concentration regions near the surfaces of the LDD layers 7 and 9, respectively, and smoothly connect the impurity concentrations of the layers 8 and 10 to that in the high-concentration impurity region.

The n-type MOSFET with this double LDD layer structure can effectively relieve the drain electric field since the first and third LDD layers 7 and 9 form the PN junction of low concentration at a relatively great depth. Further, since the second and fourth LDD layers 8 and 10 so covers the low-concentration layers made of the first and third LDD layers 7 and 9 near the surface, i.e., the high-resistance layers as to smoothly increase the decrease in concentration, it is possible to avoid a remarkable fall of an on current without locally creating a region of high electric field.

The impurity concentrations of the n+ layers 3 and 4 are usually set at $10^{20}$ cm$^{-3}$ or over so as to have low resistance.

Finally, the advantages of the MOSFET 1 of the present invention are shown in Table 1 below, as compared with the already-discussed first and second prior arts.

TABLE 1

| LDD Structure | Hot-Carrier Resistance (Relieving Drain Electric Field) | Driving Capability (Lower Resistance near Surface) |
|---|---|---|
| ① Single (The First Prior Art) | Standard | Standard |
| ② Double (The Second Prior Art) | Lower | Higher |
| ③ Double (The Present Invention) | Higher | Higher than ① and Lower than ② |

Variation of The First Preferred Embodiment

In this variation, nitrogen layers are formed at least in the regions near surfaces of the second and fourth LDD layers 8 and 10, to reduce an interface state. An example of specific structure will be discussed below, referring to FIG. 7.

Figure 7:
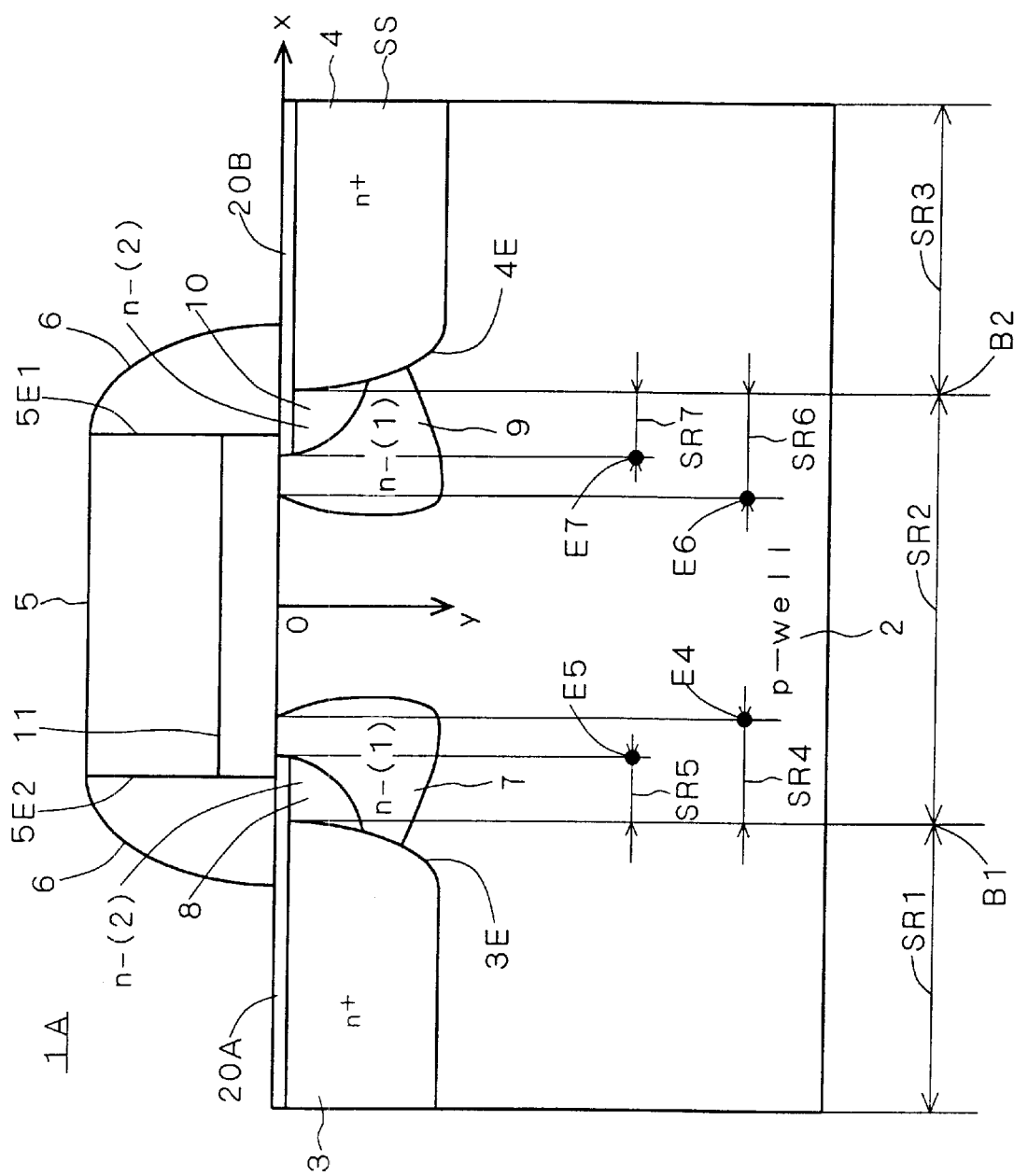
FIG. 7 is a vertical section showing an n-type MOSFET with double LDD layer structure in accordance with a variation of the first preferred embodiment of the present invention.

As shown in FIG. 7, a first nitrogen layer 20A is formed in a region (in the vicinity of the surface) at a relatively shallow depth inside the semiconductor substrate 2 from the fifth and first surface regions SR5 and SRI in the surface of the semiconductor substrate. Symmetrical to this, a second nitrogen layer 20B is formed in the vicinity of the surface inside the semiconductor substrate 2 from the seventh and third surface regions SR7 and SR3.

Providing the first and second nitrogen layers 20A and 20B, the nitrogen in the layers 20A and 20B terminate unused bond of radical existing near an interface (e.g., Si/SiO$_2$ interface) between the semiconductor substrate 2 and the gate insulating film 11, i.e., dangling bond. This reduces the interface state. And this reducing effect allows a further improvement in hot-carrier improvement. In terms of manufacturing process, a step of implanting nitrogen is added, as discussed later.

The Second Preferred Embodiment

Hereinafter, referring to FIGS. 8A to 8H, a method of manufacturing an n-type MOSFET with double LDD layer will be discussed.

Figure 8A:
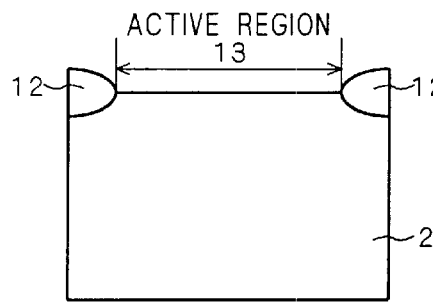
FIGS. 8A to 8H are vertical sections showing process steps of manufacturing an n-type MOSFET with double LDD layer structure in accordance with a second preferred embodiment of the present invention.
Figure 8E:
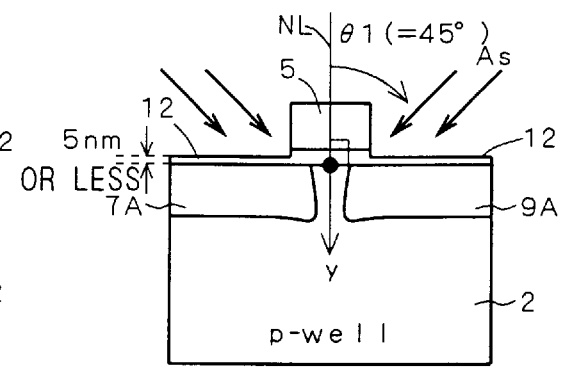
Figure 8B:
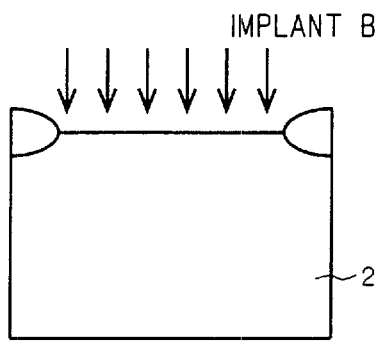

Like the prior-art method, as shown in FIG. 8A, an isolation oxide film 12 is formed and part of the semiconductor substrate 2 in an active region 13 is implanted with boron ion as the channel impurity of the first conductivity type, to form a p-well inside the semiconductor substrate 2 (see FIG. 8B). An insulating layer 11 (having a thickness of 11$t$) to be a gate insulating film is formed on the surface of the p-type semiconductor substrate, and a polycrystalline silicon layer 5A to be a gate electrode (control electrode) is deposited thereon (see FIG. 8C). After that, the polycrystalline silicon layer 5A for gate electrode is dry-etched to form the gate electrode 5 and the gate insulating film 11, and further the etching is controlled so that the thickness 12$t$ of residual part of the insulating layer 11A may become 50 Å or less, to form an insulative through film 12 which covers the semiconductor surface in the active region 13 on the periphery of end surfaces of the gate insulating film 11 (see FIG. 8D).

Next, the p-well is implanted with arsenic which is an example of the first impurity through the through film 12 at a first tilt angle θ1 of 45 degrees at a dose of 3E13 cm$^{-2}$ at an energy of about 100 keV, to form first impurity layers 7A and 9A of low concentration (see FIG. 8E). The tilt angle refers to an angle of ion implantation and an angle made by a normal direction NL of the surface of the semiconductor substrate 2 and a direction of ion implantation. For example, when the surface of the semiconductor substrate is (100) surface, part of implanted ions most easily causes the channeling phenomenon at 45 degrees. Since this surface is (100) surface, the arsenic implanted at the first tilt angle of 45 degrees forms, in the p-well, ① a main distribution not caused by the channeling effect in a region near the surface of the substrate and ② a tail distribution created by ions flying to great depths in the channel portion due to the channeling phenomenon, where the impurity concentration with respect to the horizontal direction so gradually increases towards the channel impurity concentration value ($10^{17}$ cm$^{-3}$ order) (whose concentration gradient is much smaller than that of arsenic in the main distribution of ①).

On the other hand, since arsenic has a small diffusion coefficient, in the first impurity layers 7A and 9A in the vicinity of the surface of the semiconductor substrate 2, a region of slightly low concentration is created (see the region P3 of FIG. 5) up to a depth corresponding to a range of implanted arsenic (see FIG. 3) which can not cause the channeling phenomenon (e.g., a depth where the main distribution of arsenic is formed). The low-concentration region contributes, as parasitic resistance, to a fall of an on current in the MOSFET.

Figure 8F:
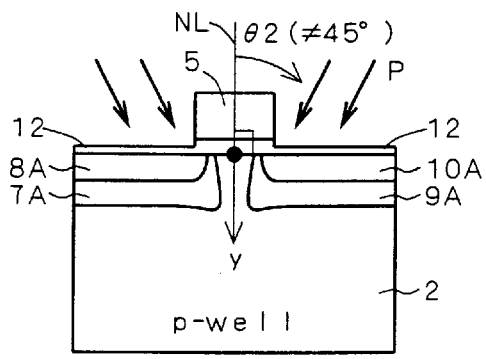

In order to compensate the impurity concentration in the low-concentration region, for example, ions of phosphorus (P) which correspond to the second impurities are implanted from surface regions of the first impurity layers 7A and 9A through the through film 12 towards the inside of the layers 7A and 9A (up to the depth where the main distribution can be created) at an energy of about 30 to 50 keV at a dose of 1E13 cm$^{-2}$ at a second tilt angle θ2 (≠45 degrees) with which no channeling phenomenon can be caused, to thereby form second impurity layers 8A and 10A where arsenic and phosphorus are mixed in the vicinity of the surfaces regions of the first impurity layers 7A and 9A, respectively (FIG. 8F). In this case, since the concentration gradient of implanted phosphorus with respect to the horizontal direction (x) is almost the same as that of arsenic at the same depth and moreover the concentration of phosphorus still increases by the decrease in concentration of arsenic even in a portion where the concentration of arsenic varies from the maximum to the minimum with respect to the horizontal direction x (see the region P3 of FIG. 5), the implanted phosphorus compensates the concentration decrease of arsenic in the low-concentration region and sufficiently contributes to smooth connection between concentration gradients of the low-concentration region of arsenic and the n+ layer of arsenic.

After that, the through film 12 is removed (FIG. 8G) and then the sidewall 6 being joined onto the end surfaces of the gate insulating film 11 and the gate electrode 5 is formed on the surface of the semiconductor substrate 2. Arsenic, for example, is implanted from the exposed surface of the semiconductor substrate 2 into the layers 7A and 8A (9A and 10A) immediately therebelow at an energy of about 50 keV at a dose of 4E15 cm$^{-2}$ at the tilt angle with which no channeling phenomenon is caused and diffused therein, to form the n+ layers 3 and 4.

By this forming method, only one ion implantation (corresponding to the step of FIG. 8F) is added, as compared with the process of manufacturing the prior-art MOSFET with single or double LDD layer structure and thereby the n-type MOSFET with the structure of the first preferred embodiment can be formed reliably and easily.

Variation of The Second Preferred Embodiment

This variation relates to a method of manufacturing the already-discussed variation of the first preferred embodiment. Summarizing its characteristic feature, a high-concentration nitrogen layer is formed in the vicinity of the surface of the semiconductor substrate by implanting high-concentration nitrogen ($N_2$) ions through an insulative through film into at least a surface region of the second impurity layer (in the following case, an LDD layer where arsenic and phosphorus are distributed), i.e., from the surface of the semiconductor substrate towards a relatively shallow portion inside the second impurity layer at a third tilt angle ($\neq 45$ degrees) with which no channeling phenomenon is caused. Specific process steps will be discussed below, referring to FIGS. 9D to 9I.

Figure 8C:
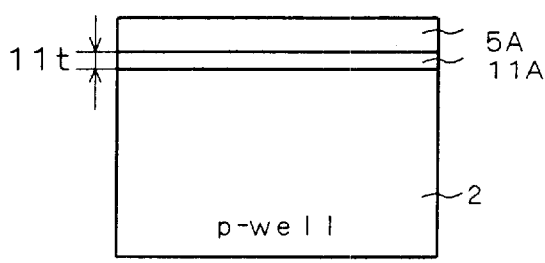

FIGS. 9D to 9I are process-step views showing a manufacturing method of this variation. Since the steps of FIGS. 8A to 8C are in common, these steps are not shown in this variation and FIGS. 9D to 9I sequentially shows steps following to that of FIG. 8C.

Figure 9D:
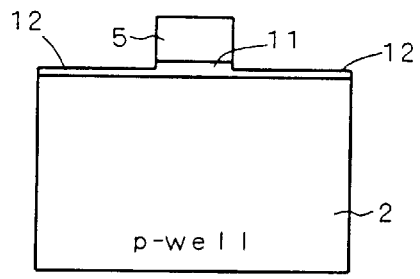
FIGS. 9D to 9I are vertical sections showing process steps of manufacturing an n-type MOSFET with double LDD layer structure in accordance with a variation of the second preferred embodiment of the present invention.

First, the insulative through film 12 having a thickness of 5 nm or less is formed by dry-etching (FIG. 9D). Arsenic is implanted into the (100) surface of the semiconductor substrate at the first tilt angle θ1 (=45 degrees) with which the channeling phenomenon can be caused (FIG. 9E) and further phosphorus is implanted at the second tilt angle θ2 ($\neq 45$ degrees) (FIG. 9F), to form the first to fourth LDD layers 7A, 8A, 9A and 10A. These steps are the same as those of FIGS. 8D to 8F.

After that, nitrogen ($N_2$) is implanted from the surfaces of the second and fourth n⁻ LDD layers 8A and 10A towards a shallow portion inside the layers 8A and 10A at an energy of about 10 keV to 20 keV at a dose of about $1.0E15$ cm$^{-2}$ at the third tilt angle ($\neq 45$ degrees), to form high-concentration first and second nitrogen layers 20A and 20B (generally termed nitrogen layer) in the vicinity of surface regions of the n⁻ LDD layers 8A and 10A, respectively. Through this, the already-discussed semiconductor device 1A of FIG. 7 is obtained.

When nitrogen implantation is performed first, an amorphous layer is formed on the substrate surface and arsenic implantation performed thereafter at the first tilt angle θ1 (=45 degrees) can not cause a channeling phenomenon enough to form a tail distribution of arsenic. Therefore, the nitrogen implantation is performed after ion implantation of arsenic and phosphorus in this variation, and this makes it possible to reliably form a tail distribution due to the channeling phenomenon in the first and third LDD layers 7 and 9.

Figure 8G:
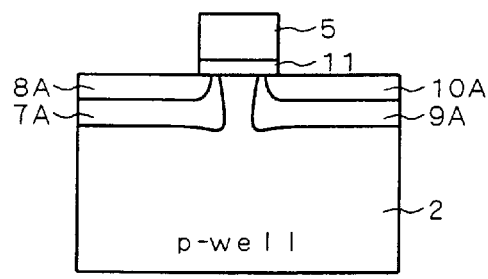
Figure 8D:
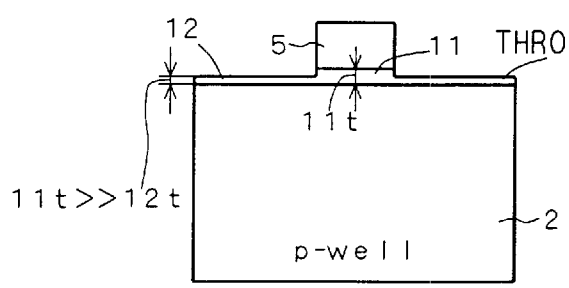
Figure 8H:
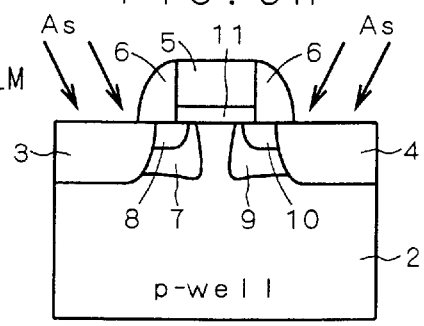
Figure 9H:
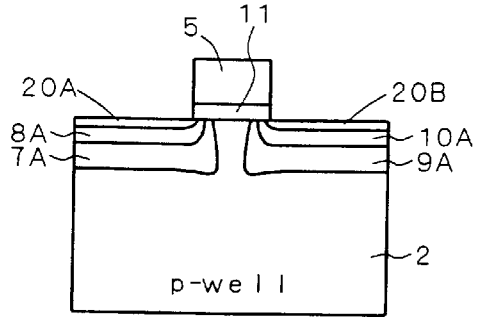
Figure 9E:
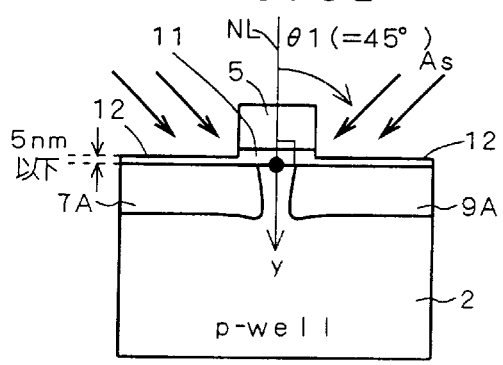
Figure 9I:
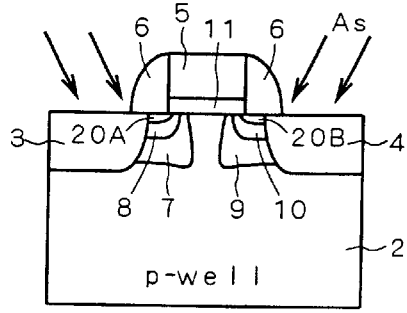
Figure 9F:
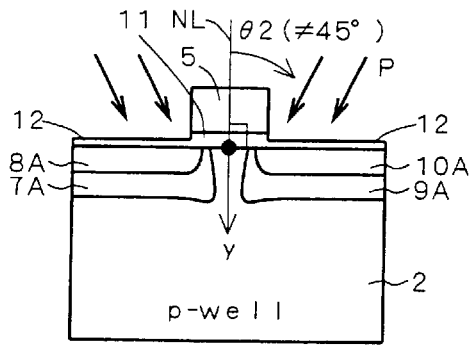
Figure 9G:
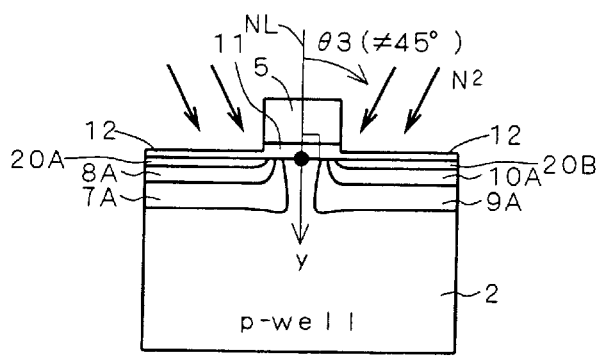
Figure 10:
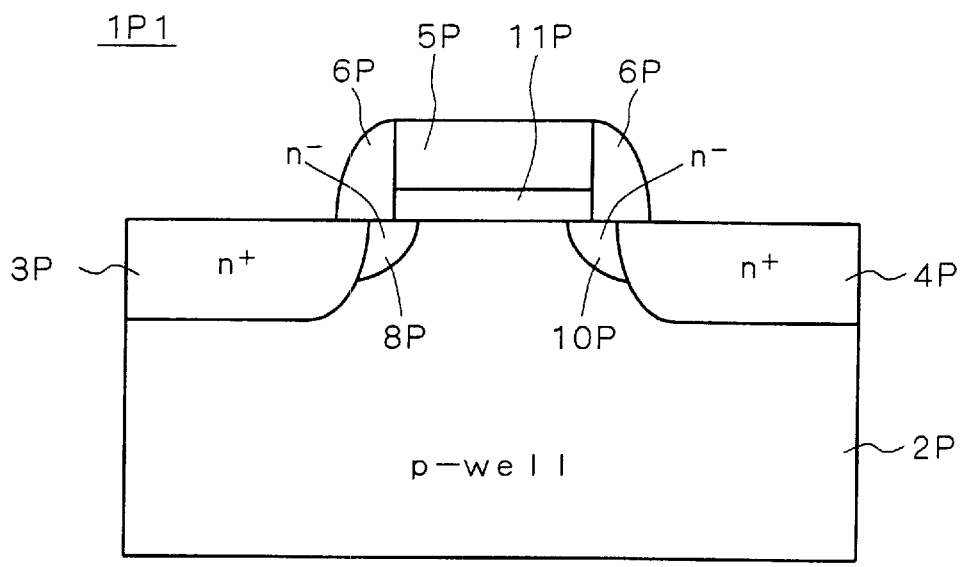
FIG. 10 is a vertical section showing an n-type MOSFET with single LDD layer structure in accordance with a first prior art.
Figure 11:
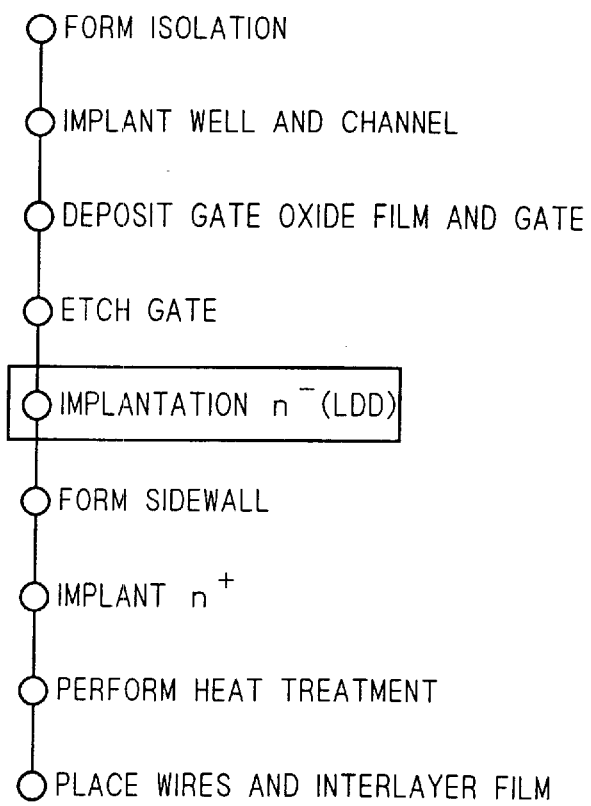
FIG. 11 is a process flow of forming the n-type MOSFET with single LDD layer structure shown in FIG. 10.
Figure 12:
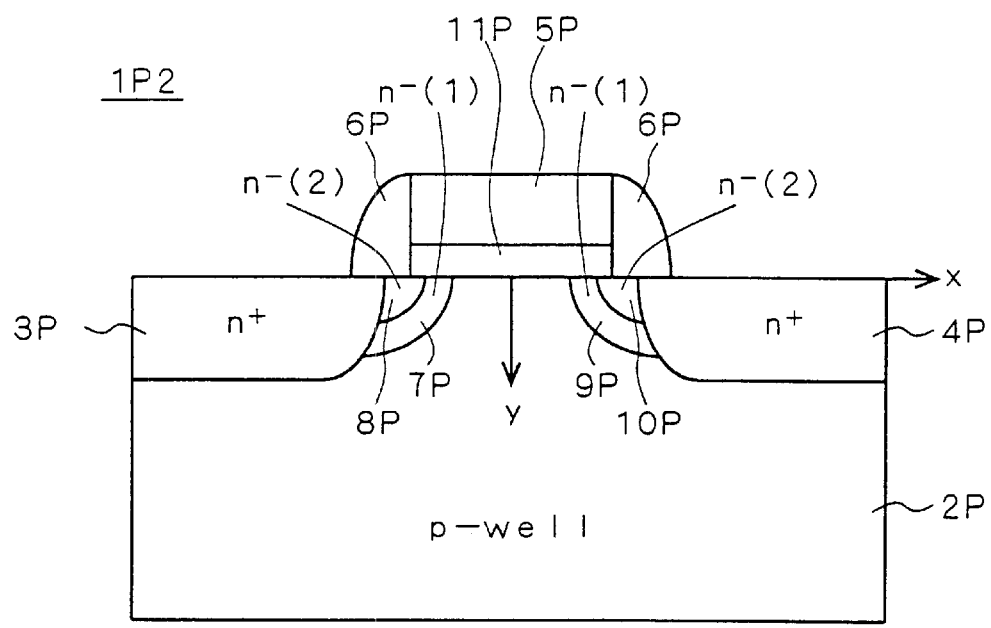
FIG. 12 is a vertical section showing an n-type MOSFET with double LDD layer structure in accordance with a second prior art.
Figure 13:
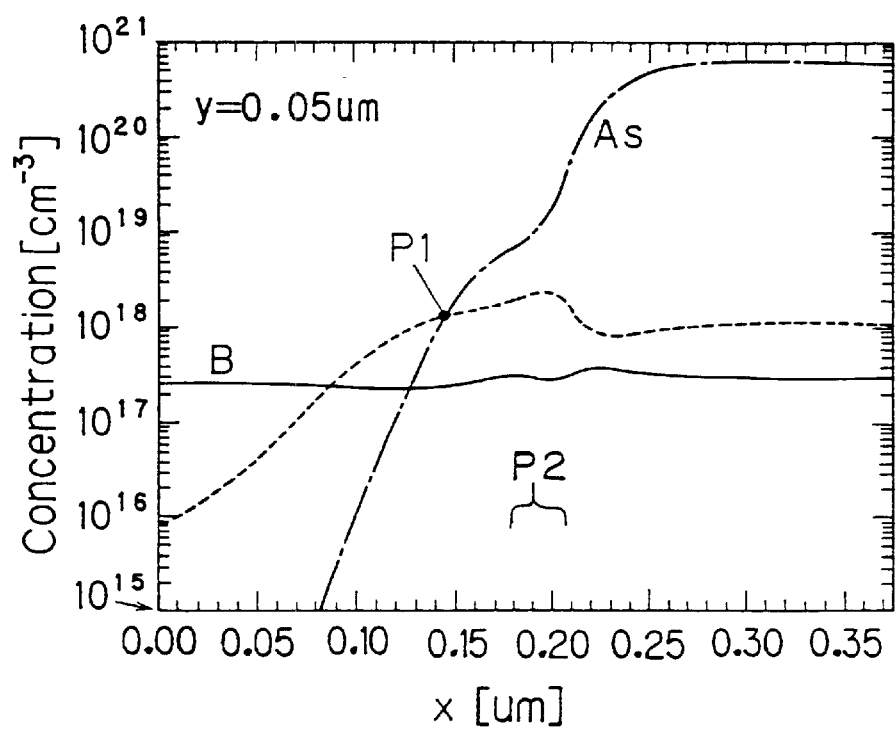
FIG. 13 shows a simulation result of impurity distribution with respect to the horizontal direction in the n-type MOSFET with double LDD layer structure in accordance with the second prior art.

After that, steps of FIGS. 9H and 9I are performed like those of FIGS. 8G and 8H.

Common Variations of The First and Second Preferred Embodiment (1) In the above discussion, though the n-type MOSFET is shown, it is natural that the above-discussed technique can be applied to a p-type MOSFET. In this case, the conductivity type (n type) of the channel impurity forming the n-well in the semiconductor substrate corresponds to "the first conductivity type" and the conductivity type (p type) of the impurities in the low-concentration p⁻ LDD layers and the p⁺ first and second high-concentration impurity regions corresponds to "the second conductivity type"

(2) The present invention is intended to form a double LDD layer structure having the tail distribution in the channel region and immediately therebelow inside the semiconductor substrate and compensate the low concentration in the region occupied by the main distribution of the first (third) LDD layer having the tail distribution by the second (fourth) LDD layer. Therefore, this characteristic feature can be applied to an IGBT which is a power transistor. For example, it is only necessary to provide the above double LDD layer structure in one of p⁻ layers adjacent to one of two n⁺ layers formed in the substrate between the gate and emitter of the IGBT.

(3) It is possible to incorporate the semiconductor devices 1 and 1A having the above double LDD layer structure in a semiconductor integrated circuit (LSI) as elements.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
    a semiconductor substrate having a channel impurity of a first conductivity type;
    a first high-concentration impurity region formed from a first surface region in a surface of said semiconductor substrate towards the inside of said semiconductor substrate, having at least one kind of impurity of a second conductivity type whose concentration is higher than that of said channel impurity;
    an insulating film formed on a second surface region adjacent to said first surface region in said surface of said semiconductor substrate;
    a control electrode formed on a surface of said insulating film;
    a second high-concentration impurity region formed from a third surface region adjacent to said second surface region in said surface of said semiconductor substrate towards the inside of said semiconductor substrate, being opposed to said first high concentration impurity region, having said at least one kind of impurity identical to that of said first high-concentration impurity region; and
    a first lightly doped drain layer formed from a fourth surface region in said second surface region on the side of an interface between said first and second surface regions towards the inside of said semiconductor substrate, being joined to at least part of an end surface of said first high-concentration impurity region opposed to said second high-concentration impurity region, having a first impurity of said second conductivity type whose concentration is lower than that of said at least one kind of impurity in said first and second high-concentration impurity regions,
    wherein said first lightly doped drain layer comprises a first main distribution having a first concentration gradient corresponding to an impurity concentration variation with respect to a horizontal direction in which an end surface of said control electrode is viewed from a center portion of said control electrode in parallel to said surface of said semiconductor substrate, where said first impurity is distributed inside said semiconductor substrate; and a first tail distribution having a second concentration gradient which is smaller than said first concentration gradient and provides a gradual increase in concentration of said first impurity towards said concentration of said channel impurity, where said first impurity is distributed inside said semiconductor substrate deeper than said first main distribution;

the semiconductor device, further comprises:

a second lightly doped drain layer formed from a fifth surface region located from said interface between said first and second surface regions, but not substantially including an inner side of an end of said fourth surface region in said first lightly doped drain layer, towards the inside of said first lightly doped drain layer, being joined to said end surface of said first high concentration impurity region, having said first impurity and a second impurity of said second conductivity type whose concentration is lower than that of said at least one kind of impurity in said first and second high-concentration impurity regions, wherein said second lightly doped drain layer comprises a second main distribution having a concentration distribution with respect to said horizontal direction which can compensate a decrease in said concentration of said first impurity near a junction between said first main distribution and said end surface of said first high concentration impurity region, where said second impurity is distributed inside said second lightly doped drain layer, and said second lightly doped layer having no tail distribution.

2. The semiconductor device according to claim 1, further comprising:

a first nitrogen layer formed from said fifth surface region towards the inside of said second lightly doped drain layer.

3. The semiconductor device according to claim 1, further comprising:

a third lightly doped drain layer formed from a six surface region in said second surface region on the side of an interface between said second and third surface regions towards the inside of said semiconductor substrate, being joined to at least part of an end surface of said second high-concentration impurity region, having a third impurity of said second conductivity type whose concentration is lower than that of said at least one kind of impurity in said first and second high-concentration impurity regions, wherein said third lightly doped drain layer comprises a third main distribution having a third concentration gradient, where said third impurity is distributed inside said semiconductor substrate; and a second tail distribution having a fourth concentration gradient which is smaller than said third concentration gradient and provides a gradual increase in concentration of said third impurity towards said concentration of said channel impurity, where said third impurity is distributed inside said semiconductor substrate deeper than said third main distribution.

4. The semiconductor device according to claim 3 further comprising:

a fourth lightly doped drain layer formed from a seventh surface region located from said interface between said second and third surface regions up to an inner side of an end of said sixth surface region in said third lightly doped drain layer towards the inside of said third lightly doped drain layer, being joined to said end surface of said second high-concentration impurity region, having said third impurity and a fourth impurity of said second conductivity type whose concentration is lower than that of said at least one kind of impurity in said first and second high-concentration impurity regions, wherein said fourth lightly doped drain layer comprises a fourth main distribution having a concentration distribution with respect to said horizontal direction which can compensate a decrease in said concentration of said third impurity near a junction between said third main distribution and said end surface of said second high-concentration impurity region, where said fourth impurity is distributed inside said third lightly doped drain layer.

5. The semiconductor device according to claim 4 further comprising:

a second nitrogen layer formed from said seventh surface region towards the inside of said fourth lightly doped drain layer.

* * * * *

UNITED STATES PATENT AND TRADEMARK OFFICE
CERTIFICATE OF CORRECTION

PATENT NO.   : 6,576,965 B2
DATED        : June 10, 2003
INVENTOR(S)  : Eikyu et al.

It is certified that error appears in the above-identified patent and that said Letters Patent is hereby corrected as shown below:

<u>Title page,</u>
The CPA information has been omitted. Item [45] and the Notice information should read as follows:
-- [45] Data of Patent: *Jun. 10, 2003

[*] Notice: This patent issued on a continued prosecution
               application filed under 37 CFR 1.53(d), and is
               subject to the twenty year patent term provisions
               of 35 U.S.C. 154(a)(2).

Subject to any disclaimer, the term of this
               patent is extended or adjusted under 35
               U.S.C. 154(b) by 0 days. --

Signed and Sealed this

Twenty-third Day of September, 2003

JAMES E. ROGAN
*Director of the United States Patent and Trademark Office*